(12) United States Patent
Krishnan et al.

(10) Patent No.: US 11,049,722 B2
(45) Date of Patent: Jun. 29, 2021

(54) METHODS AND MATERIALS FOR MODIFYING THE THRESHOLD VOLTAGE OF METAL OXIDE STACKS

(71) Applicant: Applied Materials, Inc., Santa Clara, CA (US)

(72) Inventors: Siddarth Krishnan, Newark, CA (US); Rajesh Sathiyanarayanan, Bangalore (IN); Atashi Basu, Menlo Park, CA (US); Paul F. Ma, Scottsdale, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/841,625

(22) Filed: Apr. 6, 2020

(65) Prior Publication Data

US 2020/0234959 A1    Jul. 23, 2020

Related U.S. Application Data

(63) Continuation of application No. 16/216,500, filed on Dec. 11, 2018, now Pat. No. 10,615,041.

(60) Provisional application No. 62/597,394, filed on Dec. 11, 2017.

(51) Int. Cl.
| | | |
|---|---|---|
| *H01L 21/28* | (2006.01) | |
| *H01L 21/321* | (2006.01) | |
| *H01L 29/51* | (2006.01) | |
| *H01L 21/285* | (2006.01) | |
| *H01L 29/40* | (2006.01) | |
| *H01L 29/49* | (2006.01) | |
| *H01L 21/02* | (2006.01) | |
| *H01L 29/423* | (2006.01) | |

(52) U.S. Cl.
CPC .. *H01L 21/28088* (2013.01); *H01L 21/28556* (2013.01); *H01L 21/321* (2013.01); *H01L 29/401* (2013.01); *H01L 29/4966* (2013.01); *H01L 29/513* (2013.01); *H01L 29/517* (2013.01); *H01L 21/0228* (2013.01); *H01L 21/02181* (2013.01); *H01L 21/02205* (2013.01); *H01L 21/02271* (2013.01); *H01L 29/42364* (2013.01)

(58) Field of Classification Search
CPC ............. H01L 21/02181; H01L 21/022; H01L 21/28088; H01L 21/28195; H01L 21/28194; H01L 21/823462; H01L 21/823857

See application file for complete search history.

(56) References Cited

U.S. PATENT DOCUMENTS

| | | |
|---|---|---|
| 8,309,419 B2 | 11/2012 | Schaeffer et al. |
| 9,281,310 B2 | 3/2016 | Ji et al. |
| 9,406,678 B2 | 8/2016 | Ji et al. |
| 2006/0289948 A1 | 12/2006 | Brown et al. |
| 2010/0244206 A1 | 9/2010 | Bu et al. |
| 2015/0011069 A1* | 1/2015 | Xu ..................... H01L 29/66575 438/299 |
| 2015/0129973 A1* | 5/2015 | Ji ........................ H01L 29/4966 257/369 |
| 2017/0005003 A1 | 1/2017 | Ando et al. |

* cited by examiner

*Primary Examiner* — Hoai V Pham
(74) *Attorney, Agent, or Firm* — Servilla Whitney LLC

(57) ABSTRACT

Methods of modifying the threshold voltage of metal oxide stacks are discussed. These methods utilize materials which provide larger shifts in threshold voltage while also being annealed at lower temperatures.

17 Claims, 1 Drawing Sheet

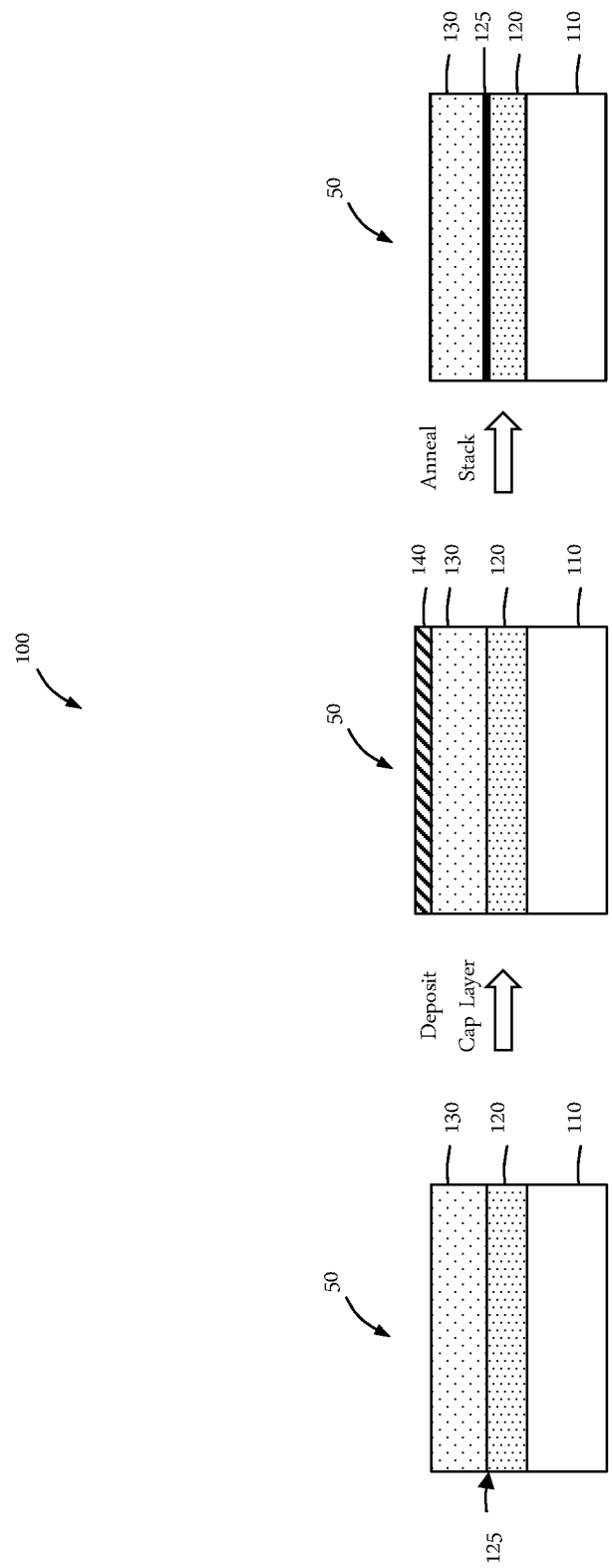

METHODS AND MATERIALS FOR MODIFYING THE THRESHOLD VOLTAGE OF METAL OXIDE STACKS

CROSS-REFERENCE TO RELATED APPLICATIONS

This application is a continuation of U.S. application Ser. No. 16/216,500, filed Dec. 11, 2018, now U.S. Pat. No. 10,615,041, issued Apr. 7, 2020, which claims priority to U.S. Provisional Application No. 62/597,394, filed Dec. 11, 2017, the entire disclosures of which are hereby incorporated by reference herein.

FIELD

Embodiments of the disclosure generally relate to the fabrication of semiconductors, including processes for formation of metal oxide stacks. More particularly, embodiments of the disclosure are directed to methods and materials for modifying the threshold voltage of metal oxide gate stacks.

BACKGROUND

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals.

The MOSFET is by far the most common transistor in digital circuits, as hundreds of thousands or millions of them may be included in a memory chip or microprocessor. Since MOSFETs can be made with either p-type or n-type semiconductors, complementary pairs of MOS transistors can be used to make switching circuits with very low power consumption, in the form of CMOS logic.

The ability to modify the threshold voltage of a given MOSFET allows for greater flexibility in design. Threshold voltage ($V_t$) and/or work function can be tuned by depositing a dielectric cap layer on the MOSFET, followed by a high-temperature anneal process. Typically, aluminum is used for p-MOS shifts and lanthanum is used for n-MOS shifts.

Unfortunately, each of these materials has limitations. Lanthanum typically requires a very high-temperature anneal (e.g. >900° C.) which can make integration into process flows difficult, especially with replacement metal gates. Aluminum typically fails to provide a sufficient shift.

Therefore, there is a need in the art for methods and materials for modifying the threshold voltage of MOSFETs.

SUMMARY

One or more embodiments of the disclosure are directed to a method comprising providing a substrate comprising a metal oxide stack. The metal oxide stack comprising a dielectric layer, a high-k dielectric layer and an interface between the dielectric layer and the high-k dielectric layer. A cap layer is deposited on the high-k dielectric layer. The cap layer comprises at least one metal selected from Co, Ni, Mn, Mo and Ga. The metal oxide stack is annealed to modify a threshold voltage of the metal oxide stack.

Additional embodiments of the disclosure are directed to methods comprising providing a substrate comprising a metal oxide stack. The metal oxide stack comprises an $SiO_2$ layer, an $HfO_2$ layer and an interface between the $SiO_2$ layer and the $HfO_2$ layer. A cap layer is deposited on the $HfO_2$ layer. The cap layer comprises at least one metal selected from Co, Ni, or Mn. The metal oxide stack is annealed under a $N_2$ atmosphere at a temperature less than or equal to 550° C. to diffuse the at least one metal through the $HfO_2$ layer to the interface and lower a threshold voltage of the metal oxide stack.

Further embodiments of the disclosure are directed to methods comprising providing a substrate comprising a metal oxide stack. The metal oxide stack comprises an $SiO_2$ layer, an $HfO_2$ layer and an interface between the $SiO_2$ layer and the $HfO_2$ layer. A cap layer is deposited on the $HfO_2$ layer by atomic layer deposition. The cap layer consists essentially of a material with a general formula $M^a_x M^b_y L_z$, where $M^a$ is selected from Ta or Ti, $M^b$ is selected from Co, Ni, or Mn, and L is selected from N, O or C. The metal oxide stack is annealed under a $N_2$ atmosphere at a temperature in a range of about 375° C. to about 550° C. to diffuse $M^b$ through the $HfO_2$ layer to the interface, lower a threshold voltage of the metal oxide stack and leave a layer comprising $M^a$ on the $HfO_2$ layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

The FIGURE illustrates a processing method in accordance with one or more embodiment of the disclosure.

In the appended FIGURE, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which processing is performed. For example, a substrate surface on which processing can be performed include, but are not limited to, materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what materials are to be deposited, as well as the particular chemistry used.

Embodiments of the disclosure advantageously provide methods of engineering or modifying threshold voltage by altering the work function of a gate dielectric. Some embodiments advantageously provide methods which are performed at low anneal temperatures. Some embodiments advantageously provide methods which result in large shifts in threshold voltage.

With reference to the FIGURE, one or more embodiment of the disclosure is directed to a method 100 for modifying the threshold voltage of a metal oxide stack. In some embodiments, the metal oxide stack is part of a gate stack in a metal oxide semiconductor (MOS).

In some embodiments, the method 100 starts with providing a substrate 110 comprising a metal oxide stack 50. The metal oxide stack 50 comprises a dielectric layer 120, a high-k dielectric layer 130, and an interface 125 between the dielectric layer and the high-k dielectric layer. As used in this manner, the term "interface" refers to the region between the dielectric layer 120 and the high-k dielectric layer 130. The skilled artisan will recognize that the interface may be one or more atomic layers thick where the atoms from the two layers co-mingle.

In some embodiments, the method further comprises forming the metal oxide stack 50. These methods comprise forming a dielectric layer 120 and forming a high-k dielectric layer 130 on the dielectric layer 120. The dielectric layer 120 and/or high-k dielectric layer 130 can be formed by any suitable technique known to the skilled artisan. Suitable techniques include, but are not limited to, chemical vapor deposition (CVD), atomic layer deposition (ALD), plasma enhanced CVD, plasma enhanced ALD and physical vapor deposition (PVD). The skilled artisan will be familiar with the various deposition processes and techniques and further description of these processes is not included.

The embodiment illustrated in the FIGURE has a separate dielectric layer 120 on the substrate 110. However, the skilled artisan will recognize that the dielectric layer 120 can be the substrate 110 or a portion of the substrate 110. For example, the high-k dielectric 130 can be formed on the substrate 110 to form the metal oxide stack 50. In some embodiments, the dielectric layer 120 is a different layer than the substrate 110.

The metal oxide stack 50 is formed on substrate 110 which can be any suitable material or shape. In the embodiment illustrated, the substrate 110 is a flat surface and the metal oxide stack 50 is represented by rectangular boxes. However, those skilled in the art will understand that the substrate 110 can have one or more features (i.e., trenches or vias) and that the metal oxide stack 50 can be formed to conform to the shape of the substrate 110 surface.

In some embodiments, the dielectric layer 120 can be formed by oxidation of the surface of the substrate 110. In some embodiments, the dielectric layer 120 can be deposited or formed as a film on the substrate. The dielectric layer 120 can be any suitable material including, but not limited to, silicon oxide. In some embodiments, the dielectric layer 120 consists essentially of silicon dioxide ($SiO_2$). As used in this specification and the appended claims, the term "consists essentially of" means that the bulk composition (not including interface regions) of the subject film is greater than or equal to about 95%, 98%, 99% or 99.5% of the specified material is the stated material.

The dielectric layer 120 of some embodiments is a native oxide on the substrate 110. For example, a silicon substrate may oxidize in air to form a native oxide layer on the silicon. In some embodiments, the thickness of the dielectric layer 120 is less than or equal to about 15 Å, less than or equal to about 10 Å, less than or equal to about 9 Å, less than or equal to about 8 Å, less than or equal to about 7 Å less than or equal to about 6 Å or less than or equal to about 5 Å. In some embodiments, the dielectric layer 120 has a thickness in the range of about 2 Å to about 15 Å, or in the range of about 5 Å to about 10 Å.

A high-k dielectric layer 130 is formed or deposited on the dielectric layer 120. The high-k dielectric layer 130 can be any suitable high-k dielectric including, but not limited to, hafnium oxide. In some embodiments, the high-k dielectric layer comprises a material with a dielectric constant greater than or equal to 4, greater than or equal to about 5, greater than or equal to about 6, greater than or equal to about 10, or greater than or equal to about 20. In some embodiments, the high-k dielectric layer 130 consists essentially of hafnium oxide.

In some embodiments, the thickness of the high-k dielectric layer 130 is in the range of about 5 Å to about 30 Å. In some embodiments, the thickness of the high-k dielectric layer 130 is in the range of about 10 Å to about 25 Å.

The high-k dielectric layer 130 can be formed by any suitable process. In some embodiments, the high-k dielectric layer 130 is deposited by atomic layer deposition (ALD) or chemical vapor deposition (CVD) using a hafnium precursor (e.g., tetrakis(dimethylamino)hafnium) and an oxidizing agent (e.g., $O_2$).

Referring again to the FIGURE, the method 100 continues with depositing a cap layer 140 on the high-k dielectric layer 130. The cap layer 140 can be deposited by any suitable method. In some embodiments, the cap layer 140 is deposited by atomic layer deposition (ALD).

The cap layer 140 can be any suitable material. In some embodiments, the cap layer 140 comprises at least one metal selected from cobalt (Co), nickel (Ni), manganese (Mn), molybdenum (Mo) and/or gallium (Ga). In some embodiments, the cap layer 140 consists essentially of one or more metals.

In some embodiments, the cap layer comprises nitrogen (N) and the cap layer is a metal nitride layer. In some embodiments, the cap layer comprises oxygen (O) and the cap layer is a metal oxide layer. In some embodiments, the cap layer comprises carbon (C) and the cap layer is a metal carbide layer. In some embodiments, the cap layer comprises one or more of N, O or C. In some embodiments, the cap layer consists essentially of a metal nitride. In some embodiments, the cap layer consists essentially of a metal oxide. In some embodiments, the cap layer consists essentially of a metal carbide. In some embodiments, the cap layer comprises one or more of a metal oxycarbide, metal oxynitride, metal carbonitride or metal oxycarbonitride. As used in this regard, a metal oxide may comprise a single metal species or a metal alloy of multiple metal species.

In some embodiments, the cap layer 140 comprises more than one metal species. In some embodiments, the cap layer 140 comprises more than one metal and only one metal is selected from Co, Ni, Mn, Mo and Ga. In these embodiments, the other metal is selected from tantalum (Ta) and titanium (Ti).

In some embodiments, the cap layer comprises a material with a general formula $M^a_xM^b_yL_z$, where $M^a$ is selected from Ta or Ti, $M^b$ is selected from Co, Ni, Mn, Mo, or Ga, and L is selected from one or more of N, O or C. In some embodiments, the cap layer consists essentially of a material with a general formula $M^a_xM^b_yL_z$, where $M^a$ is selected from Ta or Ti, $M^b$ is selected from Co, Ni, Mn, Mo, or Ga, and L is selected from one or more of N, O or C. The ratio of x to y to z can be any suitable ratio and is not limited to 1:1:1.

The cap layer 140 of some embodiments has a thickness in the range of about 5 Å to about 20 Å.

After the cap layer 140 is deposited, the method 100 continues with an anneal process. In some embodiments, annealing the substrate diffuses the metal from the cap layer 140 through the high-k dielectric layer 130 to the interface 125 between the dielectric layer 120 and the high-k dielectric layer 130. In some embodiments, greater than or equal to about 50% of the metal selected from Co, Ni, Mn, Mo, or Ga diffuses through at least about 50% of the thickness of the high-k dielectric layer 130.

Without being bound by theory, it is believed that the anneal process allows for metal atoms from the cap layer to migrate through the high-k dielectric to the interface between the high-k dielectric and the dielectric layer due to the smaller atomic radius of the cap layer metals. It is also believed that the atomic size of the metal within the cap layer and the anneal temperature affect the rate at which that metal is able to migrate through the high-k dielectric. Ultimately, the presence of these metal atoms at the interface modifies the threshold voltage of the metal oxide stack.

The anneal process may be carried out under any suitable conditions. In some embodiments, annealing is performed under an inert gas atmosphere. The inert gas of some embodiments comprises one or more of nitrogen ($N_2$), helium (He), neon (Ne), argon (Ar), krypton (Kr) or xenon (Xe). In some embodiments, the inert gas consists essentially of nitrogen ($N_2$).

In some embodiments, the metal oxide stack is annealed at a temperature less than or equal to about 700° C. In some embodiments, where the metal of the capping layer comprises Co, Mn or Ni, the metal stack is annealed at a temperature in the range of about 350° C. to about 550° C.

The identity of the metal in the cap layer determines whether the threshold voltage is increased or decreased. In some embodiments, the threshold voltage is lowered (also referred to as a pMOS shift). In some embodiments, the threshold voltage is raised (also referred to as an nMOS shift).

In those embodiments where the cap layer comprises a material with a general formula $M^a_xM^b_yL_z$, as defined previously, annealing the metal oxide stack causes $M^b$ to diffuse through the high-k dielectric layer while $M^a$ remains on the surface of the high-k dielectric layer 130. Without being bound by theory, it is believed that in these embodiments, the layer of $M^a$ which remains on the surface of the high-k dielectric layer 130, provides a protective cap layer for the metal oxide stack 50.

In some embodiments, the threshold voltage increases or decreases by less than or equal to about 3 eV, relative to a stack without the cap layer and annealing. In some embodiments, the threshold voltage increases or decreases by greater than or equal to about 1 eV. In some embodiments, the threshold voltage increases or decreases in the rage of about +3.0 eV to about −1.0 eV. In some embodiments, the threshold voltage increases by an amount greater than or equal to about 1.5 eV, 2.0 eV or 2.5 eV. In some embodiments, the threshold voltage decreases by an amount greater than or equal to about 1.0 eV, 0.5 eV or −0.5 eV.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method comprising:
    forming a dielectric layer on a substrate;
    forming a high-κ dielectric layer on the dielectric layer to form a metal oxide stack, the metal oxide stack comprising an interface between the dielectric layer and the high-κ layer,
    depositing a cap layer on the high-κ layer, the cap layer comprising at least one metal selected from Co, Ni, Mn and Ga, the cap layer having a thickness in a range of 5 Å to 20 Å; and
    annealing the metal oxide stack to diffuse the at least one metal through the high-κ layer to the interface.

2. The method of claim 1, wherein the dielectric layer is formed by oxidation of a surface of the substrate to form a native oxide.

3. The method of claim 1, wherein the dielectric layer is formed by depositing a film on the substrate.

4. The method of claim 1, wherein the dielectric layer has a thickness in a range of about 2 Å to about 15 Å.

5. The method of claim 1, wherein the high-κ layer is formed by atomic layer deposition (ALD).

6. The method of claim 1, wherein the high-κ layer is formed by chemical vapor deposition (CVD).

7. The method of claim 1, wherein the high-κ layer has a thickness in a range of about 5 Å to about 30 Å.

8. The method of claim 1, wherein the cap layer is deposited by atomic layer deposition (ALD).

9. The method of claim 1, wherein the cap layer comprises more than one metal species.

10. The method of claim 9, wherein the cap layer comprises a material with a general formula $M^a_x M^b_y L_z$, where $M^a$ and $M^b$ are different metals, and L is selected from N, O or C, and annealing the substrate diffuses $M^b$ through the high-κ layer without diffusing $M^a$ to form a layer comprising $M^a$ on the high-κ layer.

11. The method of claim 1, wherein diffusing the at least one metal through the high-κ layer to the interface modifies a threshold voltage of the metal oxide stack.

12. The method of claim 11, wherein the threshold voltage decreases.

13. The method of claim 12, wherein the threshold voltage decreases by an amount greater than or equal to about 0.5 eV.

14. The method of claim 11, wherein the threshold voltage increases.

15. The method of claim 14, wherein the threshold voltage increases by an amount greater than or equal to about 1.5 eV.

16. A method comprising:
   forming a dielectric layer on a substrate, the dielectric layer having a thickness in a range of about 2 Å to about 15 Å;
   forming a high-κ dielectric layer on the dielectric layer to form a metal oxide stack, the high-κ layer having a thickness in a range of about 5 Å to about 30 Å, the metal oxide stack comprising an interface between the dielectric layer and the high-κ layer;
   depositing a cap layer on the high-κ layer, the cap layer comprising a material with a general formula $M^a_x m^b_x L_z$, where $M^a$ is selected from Ta or Ti, $M^b$ is selected from Co, Ni, Mn, or Ga, and L is selected from one or more of N, O or C and having a thickness in a range of about 5 Å to about 20 Å; and
   annealing the metal oxide stack to diffuse the at least one metal through the high-κ layer to the interface.

17. A method comprising:
   forming a dielectric layer on a substrate;
   forming a high-κ dielectric layer on the dielectric layer to form a metal oxide stack, the metal oxide stack comprising an interface between the dielectric layer and the high-κ layer;
   depositing a cap layer on the high-κ layer, the cap layer comprising at least one metal of the group comprising Co, Mn, or Ni; and
   annealing the metal oxide stack at a temperature in a range of from about 350° C. to about 550° C. to increase or decrease a threshold voltage of the metal oxide stack by greater than or equal to about 1 eV.

* * * * *

UNITED STATES PATENT AND TRADEMARK OFFICE
CERTIFICATE OF CORRECTION

PATENT NO. : 11,049,722 B2
APPLICATION NO. : 16/841625
DATED : June 29, 2021
INVENTOR(S) : Siddarth Krishnan et al.

Page 1 of 1

It is certified that error appears in the above-identified patent and that said Letters Patent is hereby corrected as shown below:

In the Claims

Column 8, Claim 16, Line 6, replace "$M^a_x\ m^b_x\ L_z$" with "$M^a_x\ M^b_y\ L_z$".

Signed and Sealed this
Seventeenth Day of August, 2021

Drew Hirshfeld
*Performing the Functions and Duties of the*
*Under Secretary of Commerce for Intellectual Property and*
*Director of the United States Patent and Trademark Office*